United States Patent
Wu

(10) Patent No.: US 6,265,249 B1
(45) Date of Patent: *Jul. 24, 2001

(54) METHOD OF MANUFACTURING THIN FILM TRANSISTORS

(75) Inventor: Biing-Seng Wu, Hsinchu (TW)

(73) Assignee: Industrial Technology Research Institute, Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/982,004

(22) Filed: Dec. 1, 1997

Related U.S. Application Data

(62) Division of application No. 08/810,094, filed on Mar. 3, 1997, now Pat. No. 5,828,082, which is a continuation of application No. 08/431,610, filed on Apr. 28, 1995, now abandoned, which is a continuation of application No. 07/875,651, filed on Mar. 1, 1994.

(51) Int. Cl.[7] .................................................. H01L 21/00
(52) U.S. Cl. ............................ 438/158; 257/57; 257/59; 257/60; 257/61; 257/72; 438/151; 438/159
(58) Field of Search .................................. 257/57, 59, 60, 257/61, 72; 438/151, 158, 159, 30

(56) References Cited

U.S. PATENT DOCUMENTS

| | | | |
|---|---|---|---|
| 4,545,112 | * 10/1985 | Holmberg et al. | .................. 438/158 |
| 5,493,129 | * 2/1996 | Matsuzaki et al. | .................. 257/61 |
| 5,721,164 | * 2/1998 | Wu | ........................................ 438/159 |

OTHER PUBLICATIONS

Akiyama et al, "An a–SiTFT with a New Light Shield Structure and Its Application to Active Matrix Liquid Crystal Displays" IEEE 268–IEDM 1988.

Sakamoto et al. "A 10–In Diagonal Active–Matrix LCD Addressed By a–SiTFTs", Proceedings of the SID, vol. 2812, 1987, p 145–148.

Katoh, "TFT–LCD Technology Achieves Color Notebook PC" Nikkei Electronics ASIA, Apr., p68–71, 1992.

International Electron Devices Meeting Proceedings, Dec. 1988, p 268–271.

* cited by examiner

*Primary Examiner*—Tom Thomas
*Assistant Examiner*—Shouxiang Hu
(74) *Attorney, Agent, or Firm*—George O. Saile; Stephen B. Ackerman; Graham S. Jones, II

(57) ABSTRACT

An additional high quality insulating layer is grown over the substrate after the formation of the gate electrode of a thin film transistor (TFT). The growth temperature of the insulating layer can be higher than conventional method and the insulating layer is more free of pin-holes. After the insulating layer in the thin oxide region of the TFT is etched away, conventional fabrication processes are followed. The dielectric of the thin film oxide region is the same as that of the conventional TFT; but the dielectric in the vicinity of the thin oxide region, the crossovers of the data lines and the scan lines, and the gate dielectric layer of the TFT are now composed of the high quality insulating layer. The TFT structure can improve the yield of fabrication by confining the channel region in the shadow of the gate electrode to reduce the leakage photo-current, and by reducing the steps at crossovers steps and interconnections to avoid open-circuit.

30 Claims, 15 Drawing Sheets

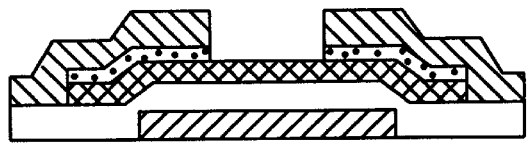
*FIG. 1A – Prior Art*
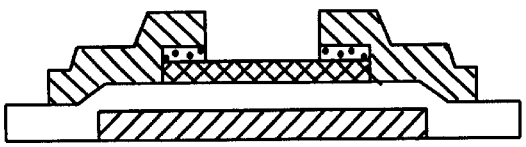
*FIG. 1B – Prior Art*
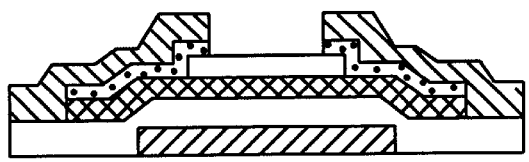
*FIG. 1C – Prior Art*
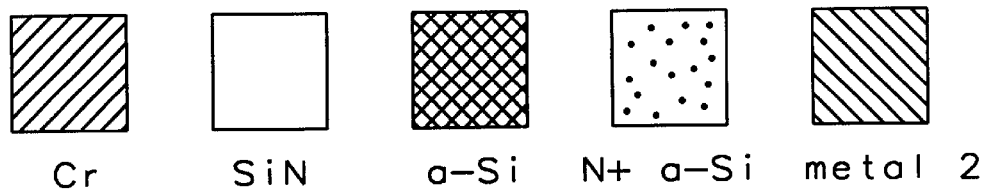
*FIG. 1D*

|  | TYPE A | TYPE B | TYPE C |
|---|---|---|---|
| mask layers (TFT) | 4 | 4 | 4 |
| etching stopper | no | no | yes |
| a-Si thickness | > 2000A | > 2000A | 500A |
| photocurrent | high | no | low |
| dark leak | < 1 pA | 10 pA | < 1pA |
| yield | M | L | H |
| TFT size | S | S | M |

FIG. 1E

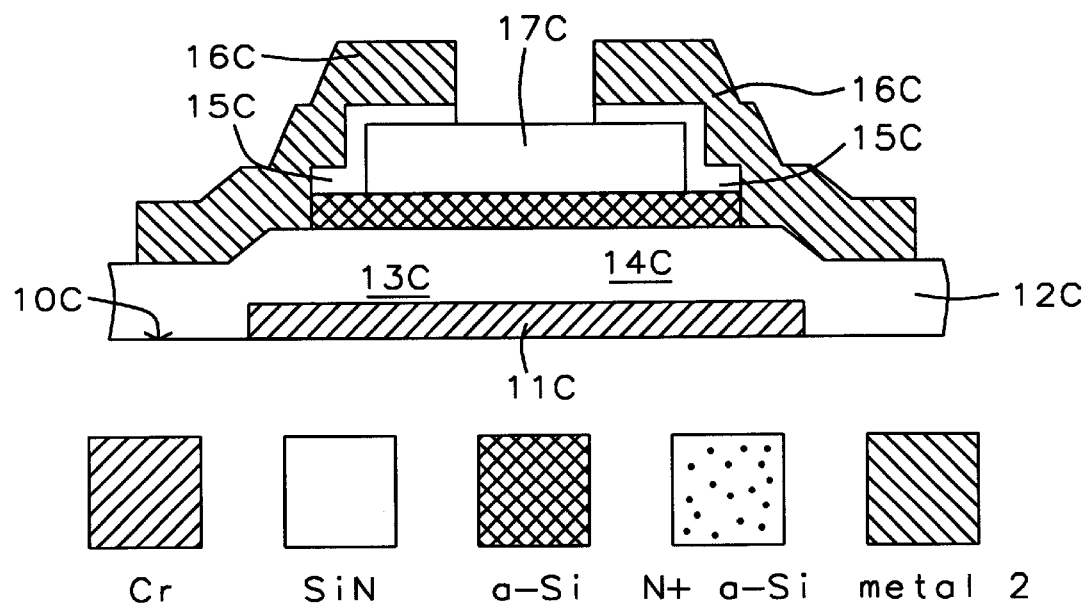
*FIG. 5 — Prior Art*
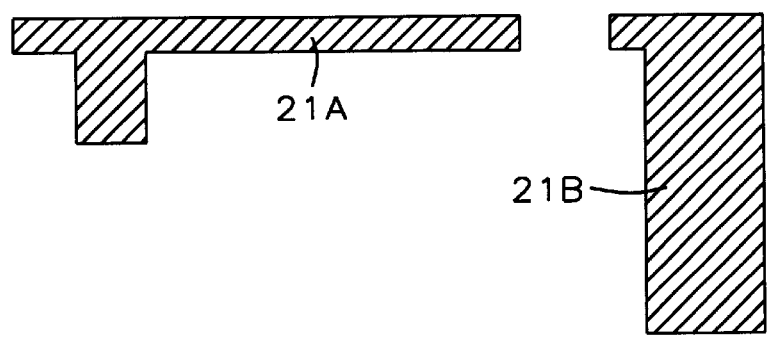
*FIG. 6A*

METHOD OF MANUFACTURING THIN FILM TRANSISTORS

This is a division of commonly assigned application Ser. No. 08/810,094, Mar. 3, 1997, now U.S. Pat. No. 5,828,082 for "Thin Film Transistor Having Dual Insulation Layer with a Window above Gate Electrode" of Biing-Seng Wu which was a continuation of Ser. No. 08/431,610, Apr. 28, 1995, abandoned which is a continuation of Ser. No. 07/875,651, Mar. 1, 1994. This application is related to commonly assigned U.S. Pat. No. 5,721,164, Ser. No. 747,503, of Biing-Seng Wu for "Method of Manufacturing Thin Film Transistors", which is also a continuation of Ser. No. 08/431, 610, Apr. 28, 1995, abandoned which is also a Continuation of abandoned application Ser. No. 07/875,651, Mar. 1, 1994.

FIELD OF THE INVENTION

This invention relates to thin film transistors (TFT), in particular to TFT for use in active matrix liquid crystal display (LCD) devices.

BACKGROUND OF THE INVENTION

TFTs are widely used for LCD panels. In such a TFTLCD system, each picture element (pixel) has LCD device and a switch to turn the LCD device on and off. A matrix of pixels are placed at the cross-points of a number of rows of sequential scan signals and a number of columns of data signals. When a scan signal and a data signal is coincident at a certain cross-point, the pixel at that particular cross-point is activated. The coincident addressing of this particular pixel is accomplished by a TFT, where the scan signal may be applied to the gate of the TFT and the data signal may be impressed on the drain of the TFT and driving the corresponding LCD from the source of the TFT.

There are a number of structures for TFTs as described in a paper by M. Akiyama et al, "An a-Si TFT with a New Light-Shield Structure and Its Application to Active Matrix Liquid Crystal Displays" *IEEE International Electron Devices Meeting Proceedings* pp. 268–271 (December 1988). In general, FIG. 1 shows the cross-sectional views of the conventional amorphous silicon (a-Si) TFTs. The table under the cross-sectional views is the comparison among the different kinds of TFTs.

The fabrication processes of type A and type B a-Si TFTs are as follows:

(1) Deposit a metal film as the gate of the TFT on a transparent substrate.
(2) Deposit a-Si, silicon nitride (a-SiN), heavily-doped a-Si (N+ a-Si) films on the substrate.
(3) Etch the N+ a-Si and a-Si films except the active region of the TFT by the standard photolithographic processes and dry etching.
(4) Open the contact holes of the TFTs.
(5) Form the source and drain contact metal of the TFT.
(6) Etch the N+ a-Si layer between the source and the drain electrodes by dry etching.

Because there is no etching stopper in the type A and type B TFTs, step 6 is controlled by the etching time, which is critical, and the thickness of the a-Si layer must be much thicker than that of the N+ a-Si layer. Typically, the thickness of the a-Si layer is more than 2000 Angstroms. Type A and type B TFTs have the same structure except that in the type A TFT, the a-Si layer protrudes beyond both edges of the gate electrode, as described by Sakamoto et al in paper, "A 10-In.-DIAGONAL ACTIVE-MATRIX LCD ADDRESSED BY a-Si TFTs", *Proceedings of the SID*, Vol.28/2, pp.145–148 (1987).

In the type B TFT the a-Si layer is located completely inside the shadow of of the gate electrodes. When this device is operated in the back gate illumination condition, leakage current is observed in the type A structure, because carriers are generated in the illuminated protruded region due to photoelectric effect. Thus, the type A TFT cannot be used in the TFTLCD. For the type B structure, the a-Si layer is totally shielded by the gate electrode. Thus, there is no photocurrent when it is operated in the back gate illumination condition. However, during the fabrication, the a-SiN layer, i.e. the gate insulating layer, beyond the active region is attacked during the $N^{31}$ a-Si etching step (Step 3). Therefore, the yield of the type B structure is very poor when it is used for the TFTLCD which is a matrix array of a large number of pixels.

In order to improve the yield of the TFT, an a-Si TFT which has a second layer of a-SiN has been developed as shown in FIG. 1C. The fabrication process of the type C device is similar to that of type A and type B, except that the top nitride (a-SiN) layer is deposited after the deposition of the a-Si film and the top a-SiN film and the top a-SiN layer is removed from the source and drain contact regions before the deposition of the N+ a-Si layer. The top a-SiN layer remains in the channel region of the transistor, and can be used as the etching stopper during etching of the N+ a-Si layer between the source and drain electrodes because the SiN is resistant to Si etch. The thickness of the a-Si layer can be made very thin, typically less than 500 Angstroms. Due to the low photon absorption in the thin a-Si layer, the a-Si layer can protrude outside both the edges of the gate electrode without incurring substantial amount of leakage current. Since the gate insulating a-SiN layer is not attacked during the formation of the active region, the type C device has a higher manufacturing yield than the type B device.

In the type A and type B devices, the channel length is equal to the space between the source and the drain electrodes. In the type C device, the channel length is equal to the length of the top a-SiN and is longer than the space between the source-drain electrodes. Thus, if the same design rule is used, the channel length of the type C device must be longer than that of type A or type B devices. Thus, the type C device occupies a large area, and is not suitable for high resolution displays. The detailed discussion of this effect is described in a paper by H. Katoh, "TFT-LCD Technology Achieves Color Notebook PC", *Nikkei Electronics ASIA*, Apr., pp.68–71 (1992).

SUMMARY

An object of this invention is to construct a thin film transistor (TFT) for active matrix liquid crystal display which is free from leakage photocurrent due to backside illumination.

Another object of this invention is to construct a TFT, which is smaller than conventional TFT.

A further object of this invention is to construct a TFT with a high yield process.

These objects are achieved in this invention by adding an insulating layer on the gate before the a-Si layer is deposited. Thus, this insulating layer can be grown at a high temperature, and free from pin holes. The a-Si layer is shielded by the gate electrode to reduce the generation of leakage photocurrent and to reduce the geometry of the structure. The structure also reduces the step at the interconnection crossings to avoid breakage. These effects improve the fabrication yield of TFT liquid crystal display panels.

BRIEF DESCRIPTION OF THE DRAWINGS

FIGS. 1A–1E show the structures of conventional thin film transistors.

FIG. 5 shows the cross section of a prior art TFT.

FIGS. 6A–6G show the masks for fabricating the TFT of the present invention.

DETAILED DESCRIPTION OF THE PREFERRED EMBODIMENT

FIGS. 2A–2G and FIGS. 8A–8H show the process flow of our invention for fabricating a high yield a-Si TFT.

Figure 2A:
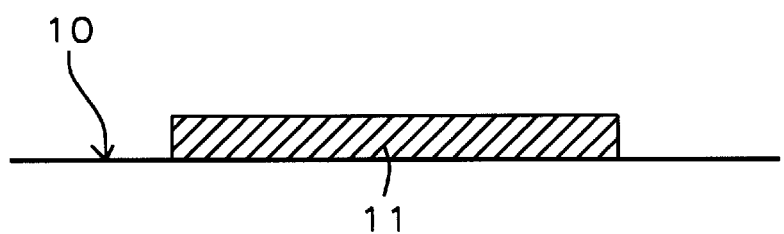
FIGS. 2A–2D show the first four steps in fabricating the TFT structure of the present invention.

The process includes the following steps:

(a) As shown in FIG. 2A, deposit and pattern a gate electrode 11 on a transparent insulating substrate 10. The preferred material is Cr.

Figure 2B:
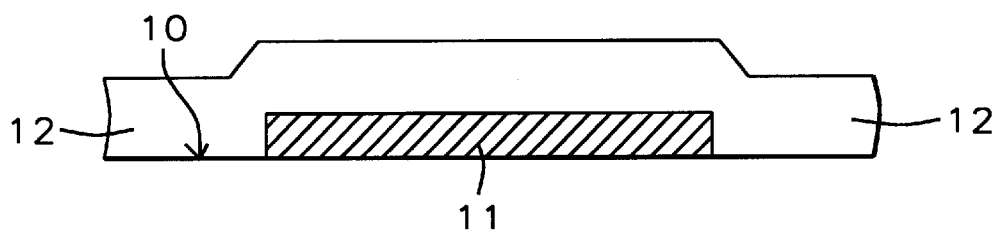

(b) As shown in FIG. 2B, deposit a first insulating layer 12 on the substrate 10.

(c) Deposit and develop a photoresist layer to open a channel window above the gate electrode 11 and smaller than the gate electrode 11 for a channel region of the TFT.

Figure 2C:
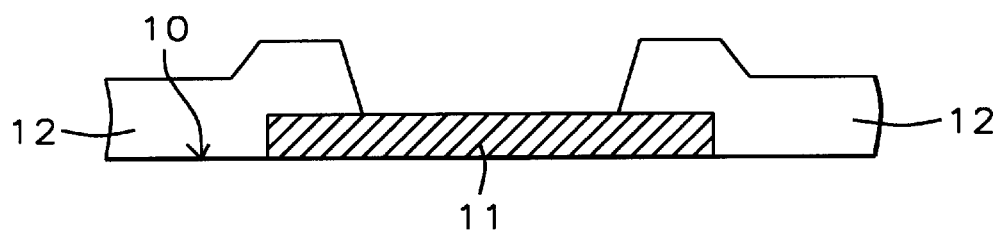

(d) As shown in FIG. 2C, etch the first insulating layer 12 through the channel window in the photoresist layer until the gate metal is bare below the channel window. At the same time, open the contact holes for the gate electrode and the scan lines.

Figure 2D:
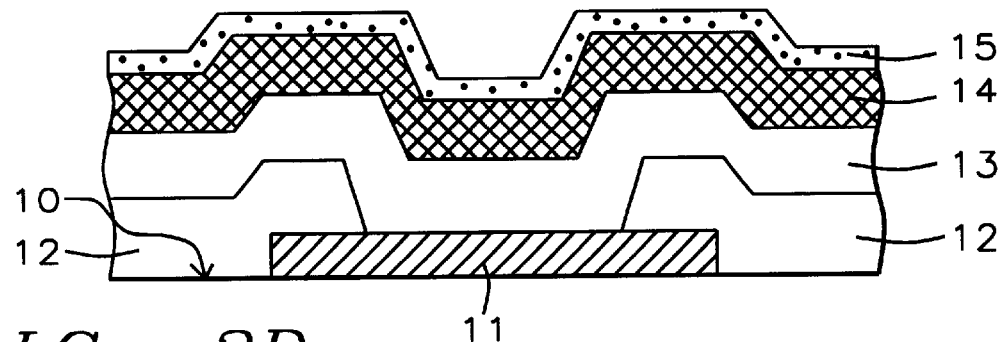

(e) As shown in FIG. 2D, deposit a conformal silicon nitride (a-SiN) film 13 (second insulating layer), a conformal amorphous silicon (a-Si) first semiconductor film 14 and a conformal heavily doped heavily doped, N+ amorphous silicon (N+ a-Si) second semiconductor film 15 on the substrate 10. The silicon nitride film 13 extends down into the channel window covering the top surface of the gate electrode leaving a first hollow above the window. The amorphous first semiconductor film 14 covers the silicon nitride film 13 and extends down into the first hollow towards the channel window leaving a second hollow above the first hollow. The heavily doped second semiconductor film 15 covers the first semiconductor film 14 extending down in the second hollow down towards the channel window leaving a third hollow above the second hollow.

Figure 2E:
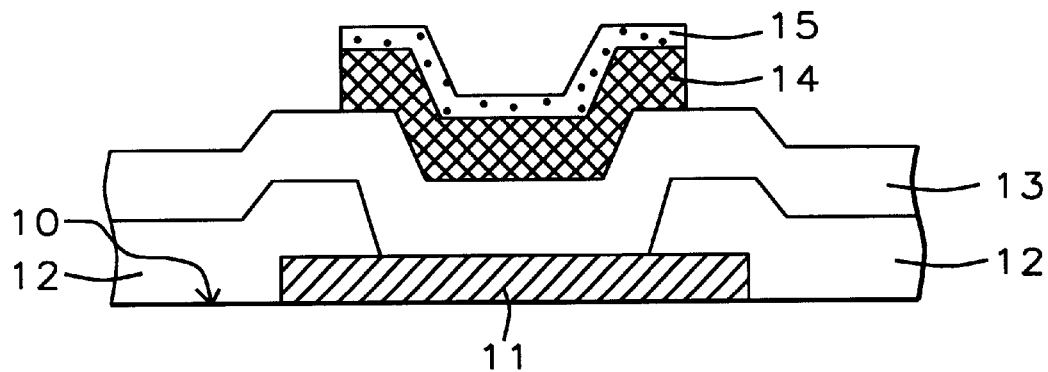
FIGS. 2E–2G show the next three steps in fabricating the TFT structure.

(f) As shown in FIG. 2E, etch the N+ a-Si film 15 and the a-Si film 14 except in the active region of the TFT by standard photographic processes and dry etching. Both the N+ a-Si film 15 and the a-Si film 14 are patterned to form an island with a length aligned with the gate electrode 11, but shorter than the gate electrode 11 to serve as the source region, the drain region, and the channel region for the TFT. The N+ a-Si film 15 and the a-Si film 14 are thus patterned into a self-aligned island above the second insulating layer 13 not aligned with the gate electrode 11.

(g) open contact holes of the TFT array through the gate insulator.

Figure 2F:
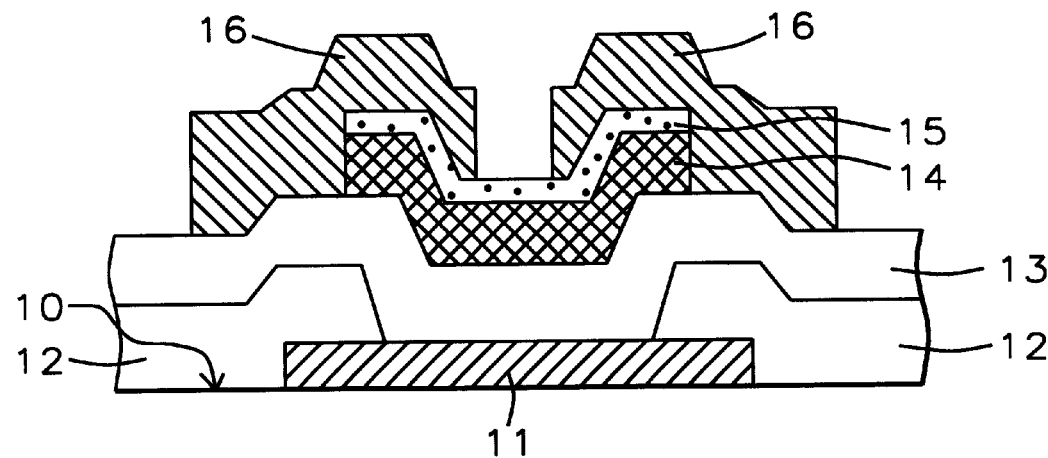

(h) As shown in FIG. 2F, form the source and drain contact metal 16 of the TFT.

Figure 2G:
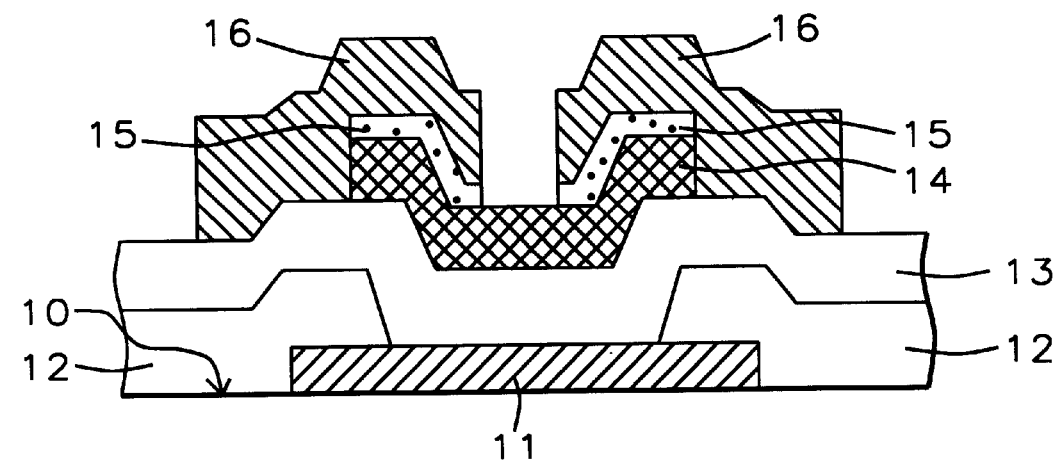

(i) As shown in FIG. 2G, etch the N+ a-Si layer between the source and the drain electrodes 16 by dry etching a hole in the N+ a-Si film 15 above gate electrode 11 forming source/drain regions in N+ a-Si film 15.

This invention has the same number of mask layers as the type C TFT in FIGS. 1A–1E. However, the structure of this invention has the following advantages over the type C TFT:

(1) The first insulating layer 12, as compared with the type C TFT, can be deposited at high temperatures (>400° C.) and has a better quality than the a-SiN, which is deposited at a lower temperature (250° C.). The top a-SiN film of the type C device is deposited after the a-Si film. The deposition temperature of the a-Si film is about 250° C. If the deposition temperature of the top a-SiN film is higher than the deposition temperature of the a-Si film, the deposited a-Si film is degraded or damaged during the a-SiN deposition process. Thus, the integrity (i.e. freedom from pin holes) of the first insulating layer of this invention is better than that of the type C device, and hence the fabrication yield of the new TFT is better than the prior art.

Figure 3A:
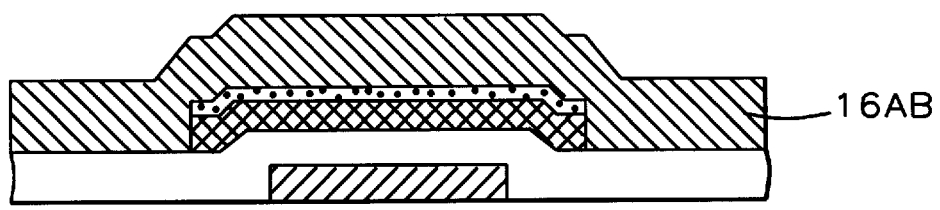
FIGS. 3A–3C show cross-sectional views of crossovers of the data line and the scan line of a LCD using the conventional TFTs and the TFT of the present invention.
Figure 3B:
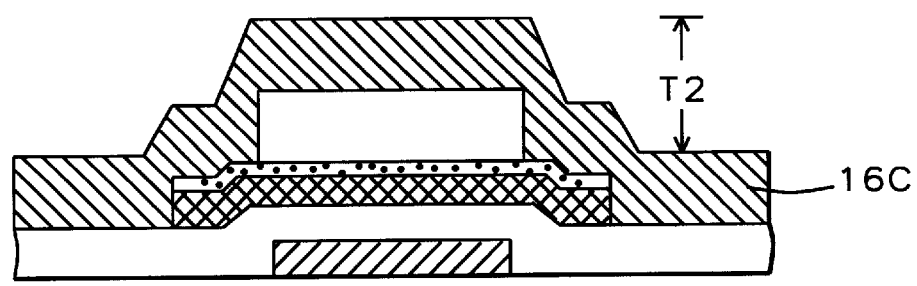
Figure 3C:
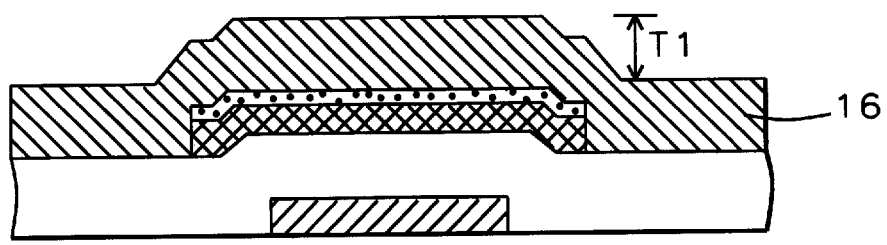
Figure 4A:
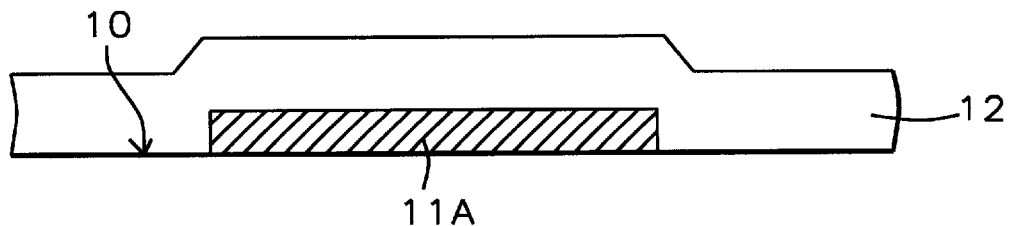
FIGS. 4A–4D show cross-sectional views of the contacts for the present invention.
Figure 4B:
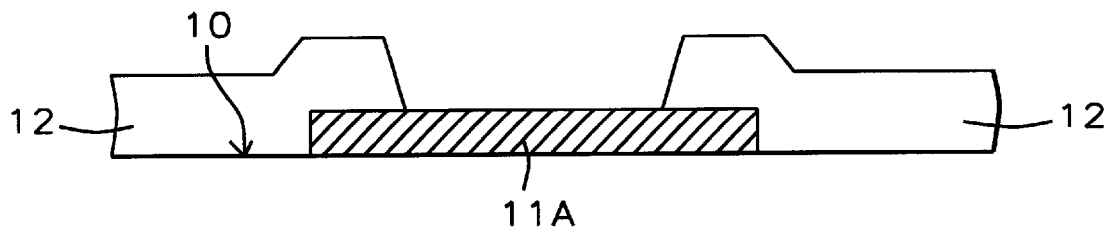
Figure 4C:
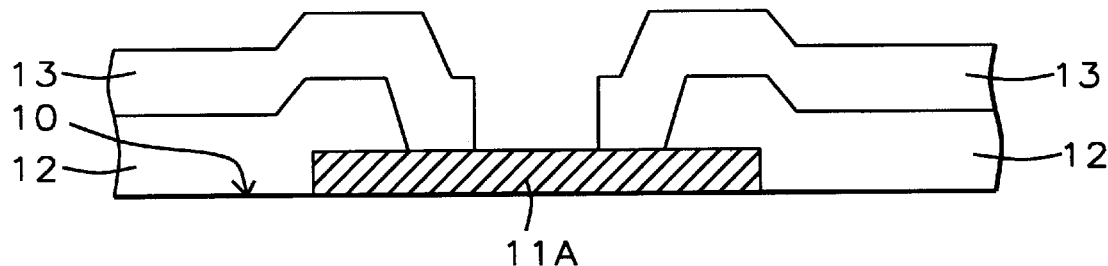
Figure 4D:
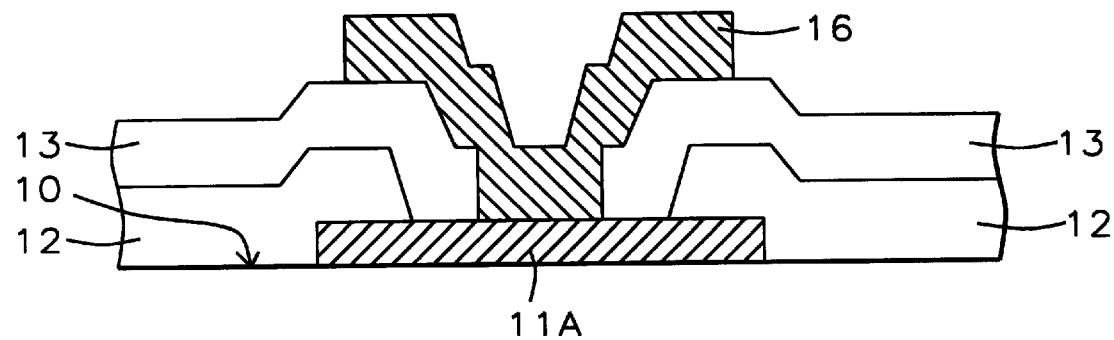

(2) The cross-sectional views of the crossovers of the data lines and the scan lines of the TFTLCD is shown in FIGS. 3A–3C. Neglecting the step caused by metal 1 (Cr), note that type A, type B and this invention have only one step T1 for the data line (metal 2, Al). However, the type C structure has two steps T2 for the data line 16C. Thus the yield of the continuity without breakage at the step of the data lines in this new structure is no worse than the type A and type B devices. Actually, the yield can be better than the type A and type B structures, because the step caused by the metal 1 step is improved by the use of multilayers, i.e., the first insulating layer 12 and the gate insulator 13.

(3) The use of two step contact holes improves the yield for this invention, as shown in FIGS. 4A–4D. The contacts 11A are located at the periphery of this display area, where the design rule is non-critical, e.g. larger than 100 μm×100 μm. Therefore the design of the contact hole is not critical.

(4) An important advantage of this invention is that the leakage photocurrent is less than that of the type A device, and is suitable for projection television which uses the TFTLCD panel as the light valve. Some manufacturers use the the type C prior art device for this purpose, as shown in FIG. 5. In FIG. 5, the substrate 10C and the films 12C, 13C, 14C, 15C and 16C correspond to substrate 10, films 12, 13, 14, 15 and 16 in FIGS. 2A–2D and FIGS. 2E–2G respectively. The a-Si film 14C is located entirely inside the shadow of the gate electrode 11C. However, the "weak point" of the type C TFT is at the edge of the source-drain electrodes, which occupies a larger area.

(5) The channel length of the TFT of this invention is equal to the space between the source electrode and the drain electrode, as shown in FIG. 2G. In the type C device, the length of the channel 14C is equal to the length of the top a-SiN layer and is longer than the space between the source and drain electrodes. Therefore, if the same design rule is used, the channel length of the type C TFT must be longer than that of the type A or type B devices. In other words, the channel length and hence the transistor size of the type C device is larger than that of this invention.

Figure 6B:
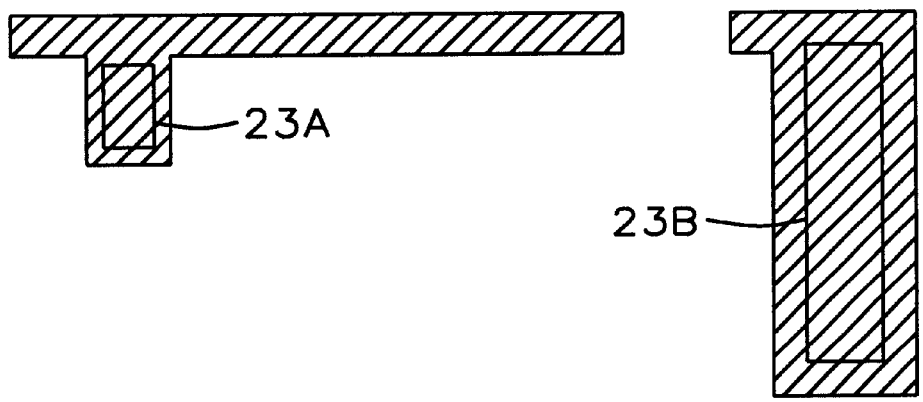
Figure 6C:
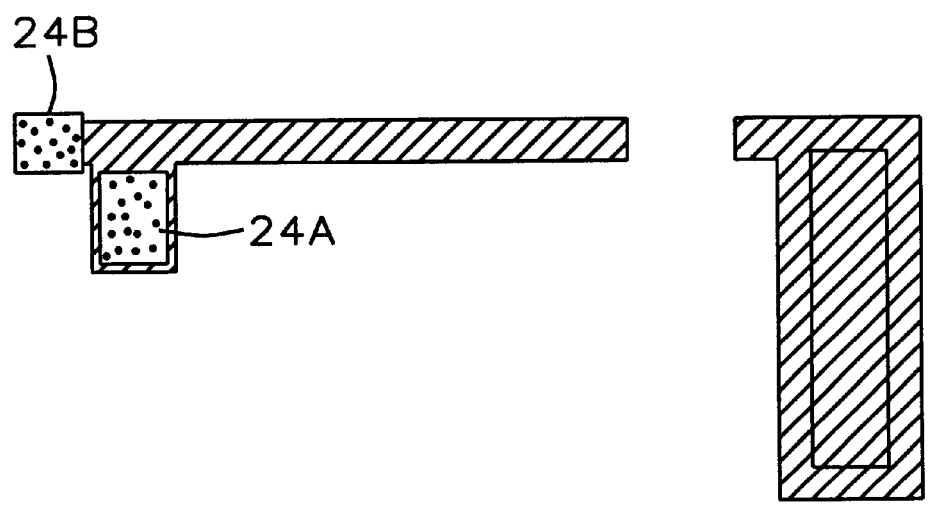
Figure 6D:
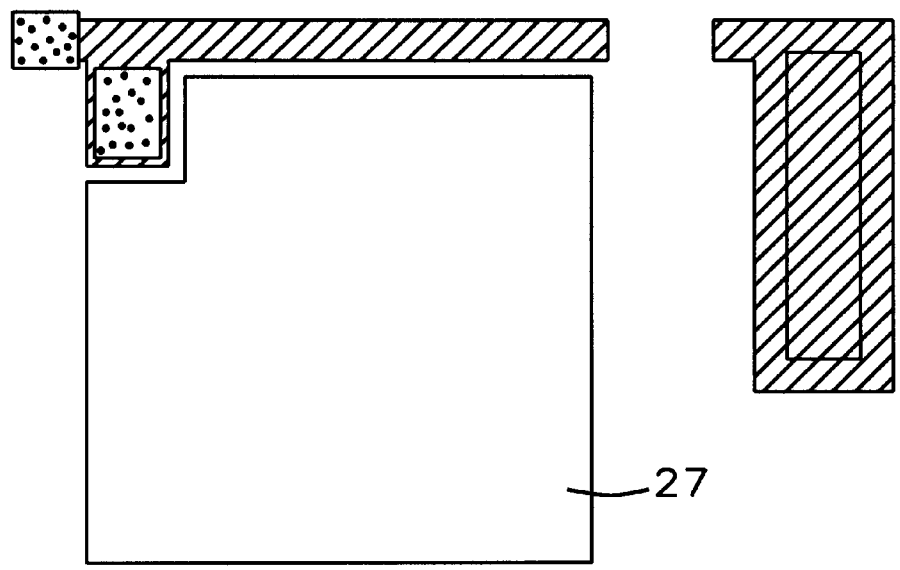
Figure 6E:
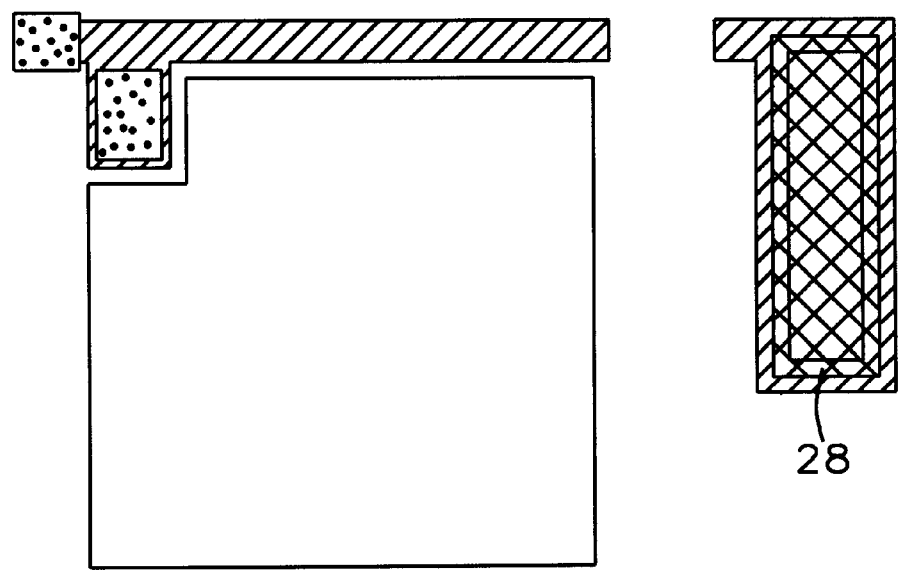
Figure 6F:
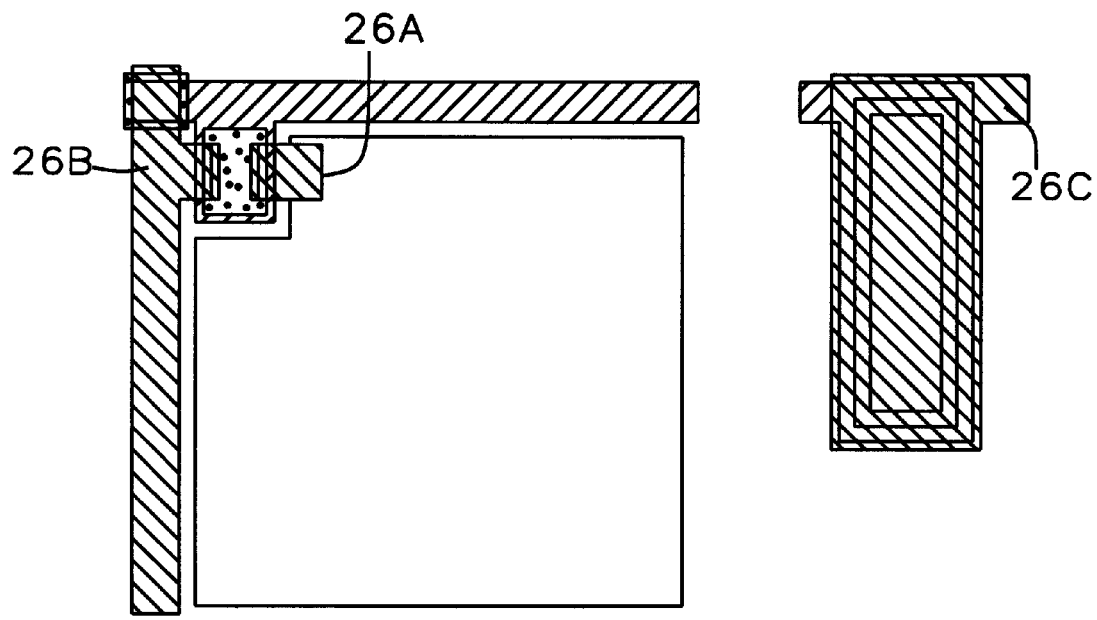
Figure 6G:
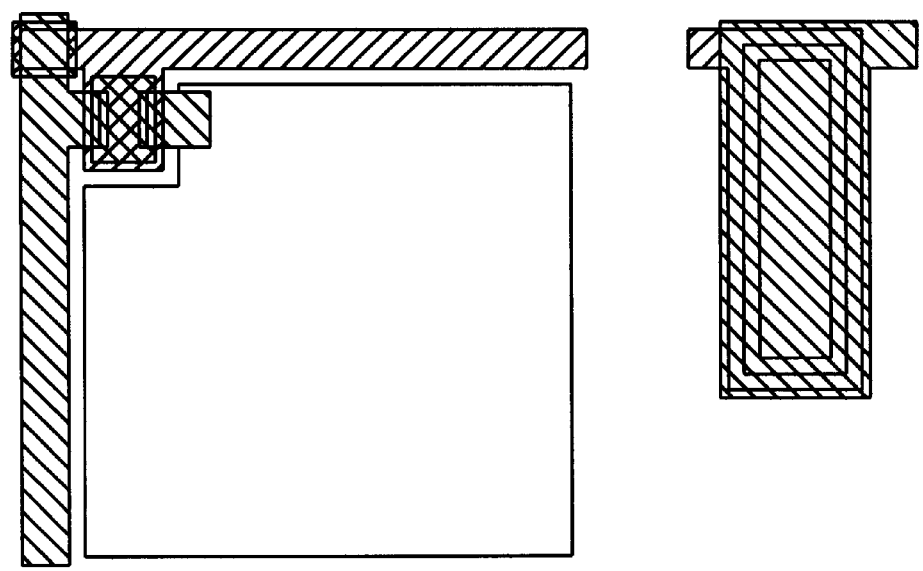

The plan views of each mask layer of this invention are shown in FIGS. 6A–6G. FIG. 6A shows the first mask to pattern the gate electrode 21A and the scan line 21B. FIG. 6B shows the second mask to pattern the windows 23A, 23B of the first insulating layer for the TFT region and the contact region, respectively. FIG. 6C shows the third mask to pattern the active region 24A of the TFT and the cross-over region 24B of the data line and the scan line. FIG. 6D shows the fourth mask to pattern the transparent pixel electrode 27 of indium tin oxide (ITO). FIG. 6E shows the fifth mask to pattern the contact windows 28. FIG. 6F shows the sixth mask to pattern the source-drain 26A of the TFT and the data line 26B of the panel. The contact metal 26C for the contact window is also defined. Then, as shown in FIG. 6G, the N+ a-Si 24A between the source and the drain electrodes is etched without photo-masking showing the seventh mask for etching the N+ a-Si 24A between the source and the drain electrodes. FIGS. 8A–8E and FIGS. 8F–8H show the modified structure of the present invention, in which a double-layered gate insulator is used to reduce gate leakage.

Figure 8A:
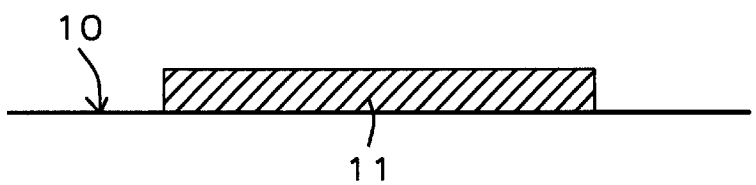
FIGS. 8A–8E show the first five steps in fabricating a modified TFT structure of the present invention with double-layered gate insulator.

The process includes the following steps:

(a) As shown in FIG. 8A, deposit and pattern a gate electrode 11 on a transparent substrate 10. The preferred material is Ta, Al etc.

Figure 8B:
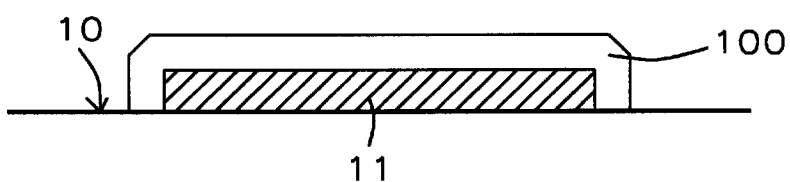

(b) As shown in FIG. 8B, form a first conformal insulating layer 100 on the surface of the gate electrode leaving the remainder of the surface of the substrate 10 exposed. The first insulating layer 100 is a metal oxide material such as $Ta_2O_5$ or $Al_2O_3$ can be formed on the surface of the electrode by sputtering of anodization, as explained in a published paper by Y. Nanno et al., "High-resolution 6-inch LCD using a-Si TFT with $TaO_x$/SiN double insulating layer", Displays, January 1990, pp.36–40, and another paper by Y. Yamamoto et al, "A new a-Si TFT with $Al_2O_3$/SiN Doubled Layered Gate Insulator for 10.4-inch Diagonal Multicolor-Display" *IEEE International Electron Devices Meeting Proceedings*, pp.851–854 (1990).

Figure 8C:
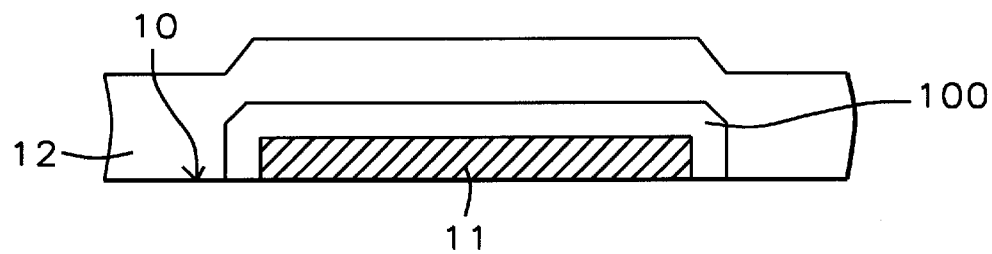

(c) As shown in FIG. 8C, deposit a conformal, second insulating layer 12 covering the substrate 10 and the first insulating layer 100.

(d) Deposit and develop a photoresist layer to open a channel window above gate electrode 11 and smaller than the electrode 11 for a channel region of the TFT.

Figure 8D:
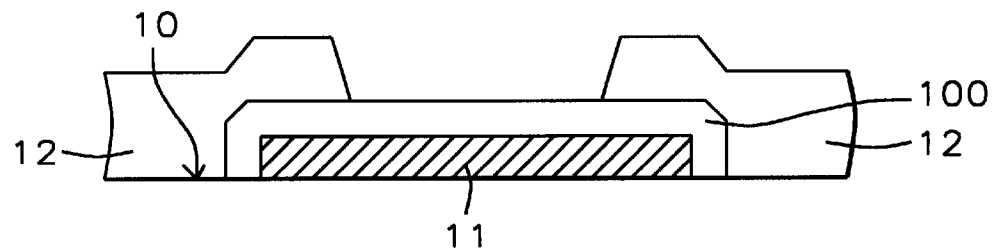

(e) As shown in FIG. 8D, etch the second insulating layer 12 through the channel window in the photoresist layer the second insulating layer 12 until the first insulating layer is bare below the channel window. At the same time, in the second insulating layer over the contact region, holes are opened.

Figure 8E:
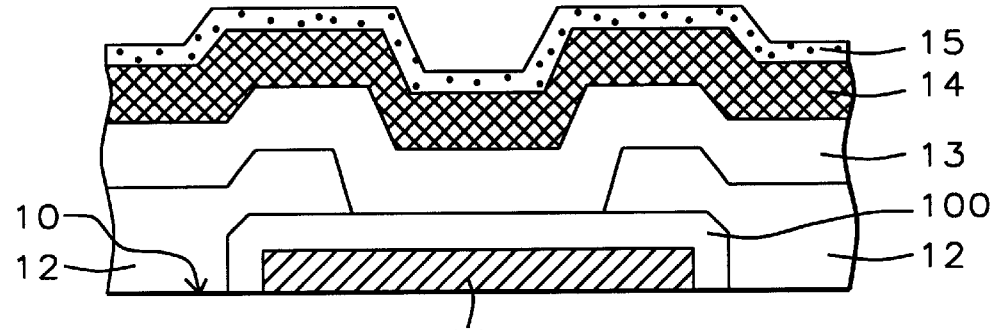

(f) As shown in FIG. 8E, deposit an a-SiN film 13, an a-Si film 14 and a heavily doped, N+ a-Si semiconductor film 15 on the substrate 10. The films 13, 14 and 15 are conformal.

Figure 8F:
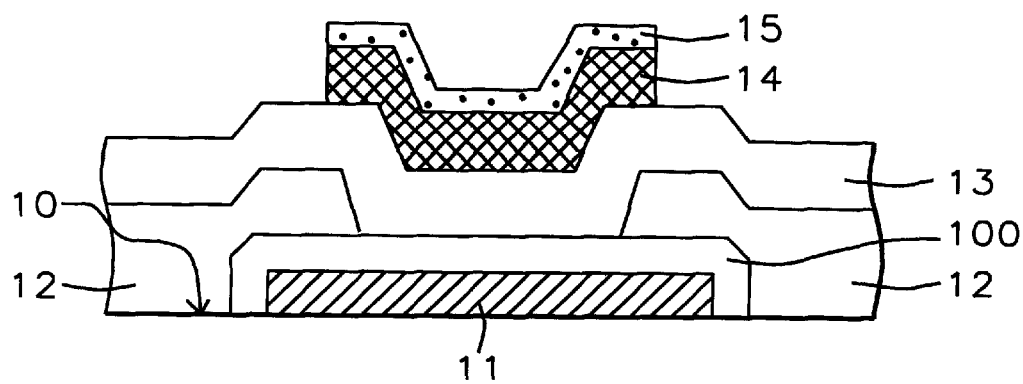
FIGS. 8F–8H show the next three steps in fabricating the modified TFT.

(g) As shown in FIG. 8F, etch heavily doped, N+ a-Si through the window in the photoresist layer semiconductor film 15 and a-Si films except in the active region of the TFT by standard photolithographic processes and dry etching, patterning the N+ a-Si film 15 and the a-Si film 14 into a self-aligned island which is not aligned with the gate electrode 11.

(h) open contact holes of the TFT array through the gate insulator, as shown in FIGS. 9A–9D, which consists of the a-Si film 13 and the first insulating layer 100 by the standard photolithographic processes.

Figure 8G:
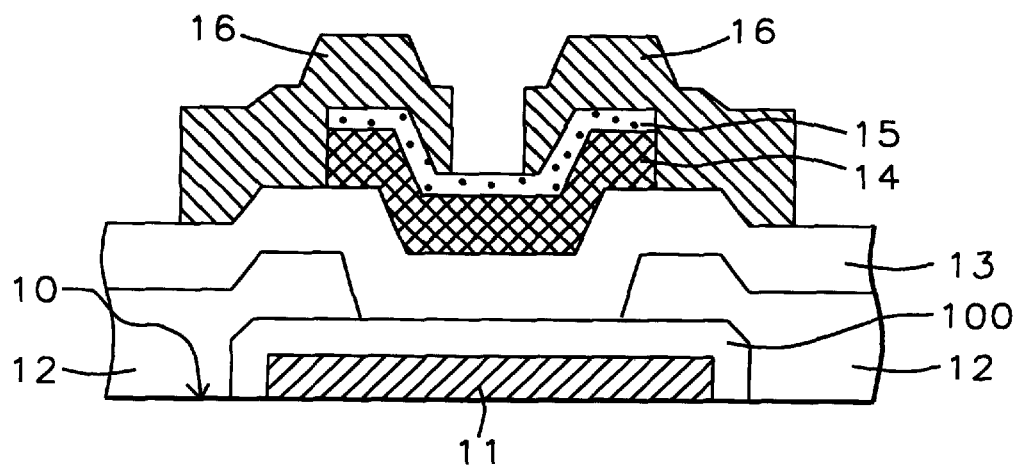

(i) As shown in FIG. 8G, form the source and drain contact metal 16 of the TFT.

Figure 8H:
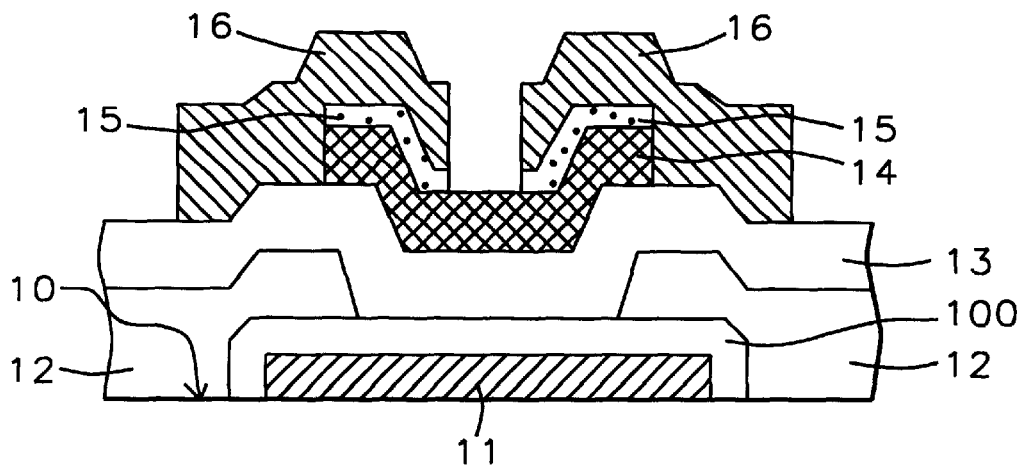
Figure 9A:
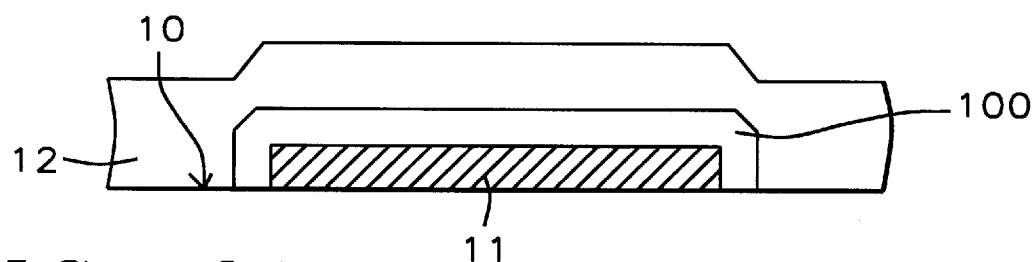
FIGS. 9A–9D show the cross-sectional views of the modified contacts of the present invention.
Figure 9B:
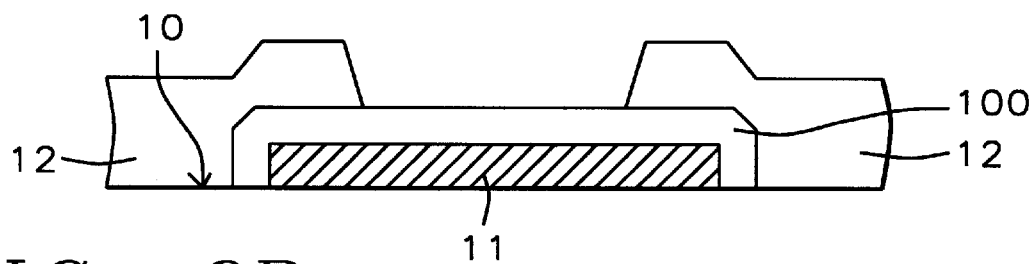
Figure 9C:
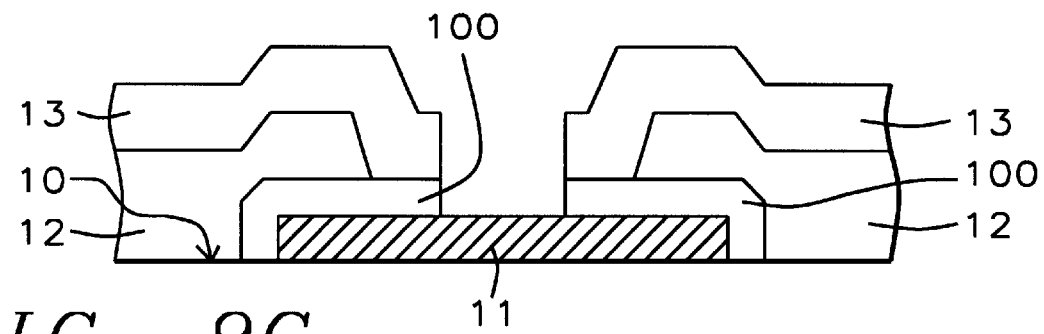
Figure 9D:
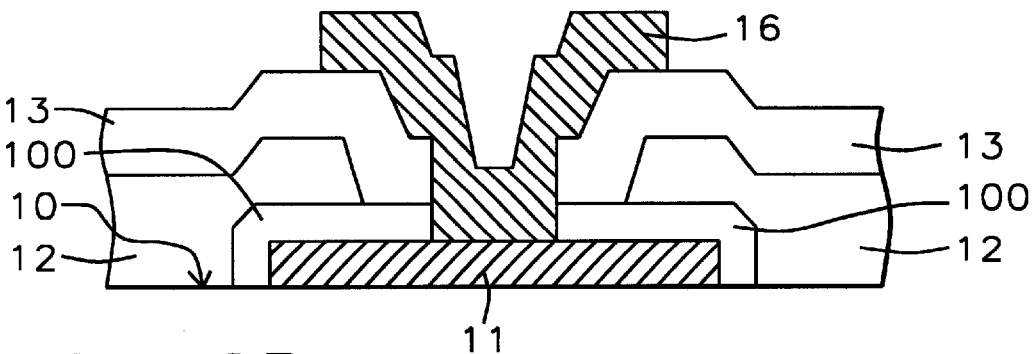

(j) As shown in FIG. 8H, etch the N+ a-Si heavily doped amorphous semiconductor film 15 layer between the source and the drain electrodes by dry etching a hole in the N+ a-Si film 15 above gate electrode 11 forming source/drain regions in N+ a-Si film 15.

Figure 7A:
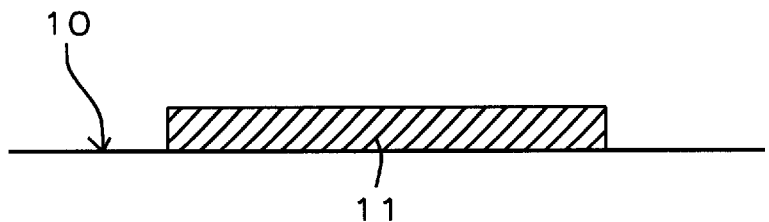
FIGS. 7A–7G show the process flow of a second embodiment of the present invention.
Figure 7B:
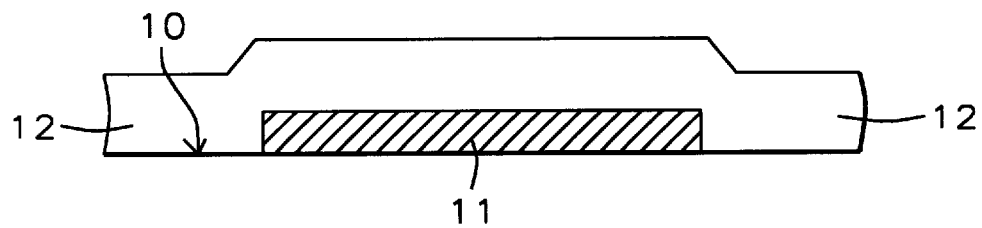

FIGS. 7A and 7B show the process flow of a second embodiment of this invention. The cross-over region of this embodiment has three dielectric layers. Thus, the manufacturing yield is higher than the first embodiment, because of the thicker layer. However, this process requires one more mask layer than the first embodiment.

The fabrication process is as follows:

(a) As shown in FIG. 7A, produce the gate electrode 11 on the substrate 10. The preferred material is Cr, Ta, Al etc. Again, if Ta or Al is used as the gate material, metal oxide such as Ta2O5 or Al2O3 (not shown in FIG. 7A can be formed on the surface of the electrode.

(b) As shown in FIG. 7B, deposit a first insulating layer 12 on the substrate 10.

(c) Deposit and develop a photoresist layer to open a channel window above the gate electrode 11 and smaller than the gate electrode 11 for a channel region of the TFT.

Figure 7C:
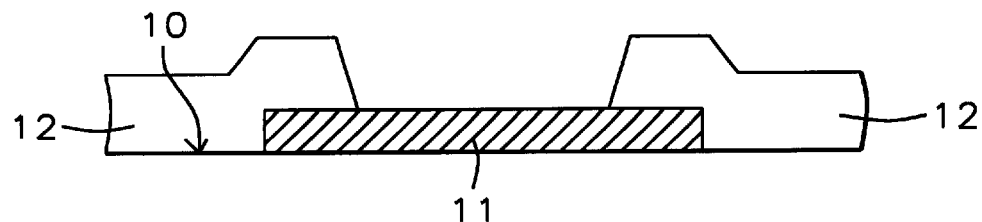

(d) As shown in FIG. 7C, etch the first insulating layer 12 through the channel window in the photoresist layer until the gate metal 11 is bare below the channel window. At the same time, the contact holes for the gate electrode and the scan line are opened.

Figure 7D:
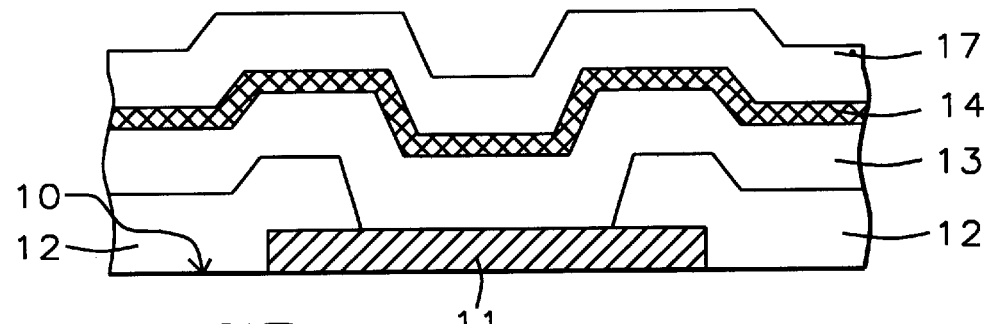

(e) As shown in FIG. 7D, deposit the a-SiN 13, a-Si 14 and top a-SiN 17 films on the substrate 10. The films 13, 14 and 17 are conformal to the layers below. The function of the top a-SiN film is to passivate the active channel region and serves as the etching stopper during the N+ a-Si etching.

Figure 7E:
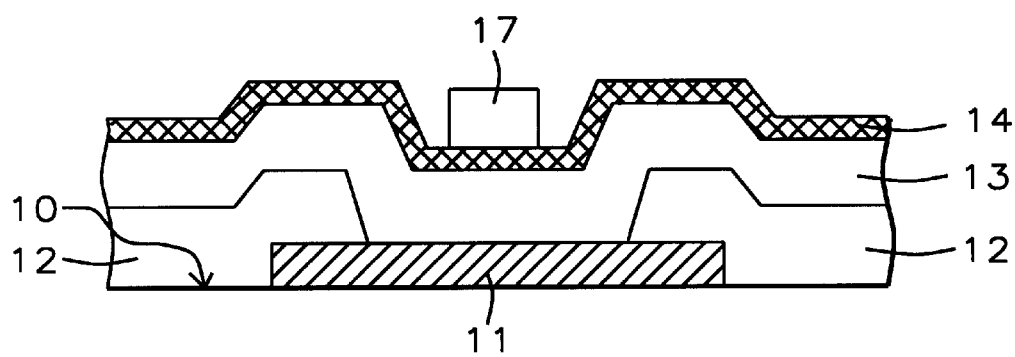

(f) As shown in FIG. 7E, etch the top a-SiN (silicon nitride) film 17 forming an etch stop block patterned from a third insulating layer centered over the gate electrode 11. The usual masking is employed, as will be well understood by those skilled in the art, to protect the block during etching.

Figure 7F:
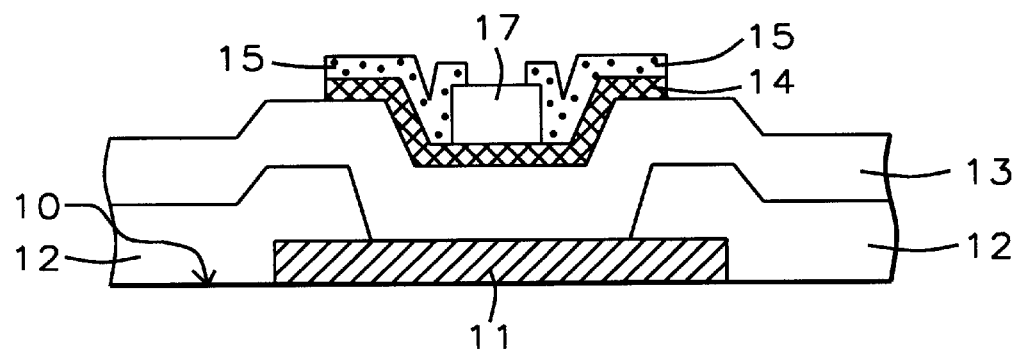

(g) As shown in FIG. 7F, deposit a heavily doped a-Si (N+ a-Si) layer 15 on the substrate 10. The layer 15 is conformal to the structure below.

(h) Etch the N+ a-Si film 15 and the a-Si film 14 except the active regions of the TFT by the standard photolithographic processes, patterning the N+ a-Si film 15 and a-Si film 14 into a self-aligned island which is not aligned with the gate electrode 11 and dry etch the N+ a-Si film 15 between the source and drain electrodes forming a hole in N+ a-Si film 15 above gate electrode 11 forming source/drain regions in the N+ a-Si film 15.

(i) Open the contact holes of the TFT array through the gate insulator.

Figure 7G:
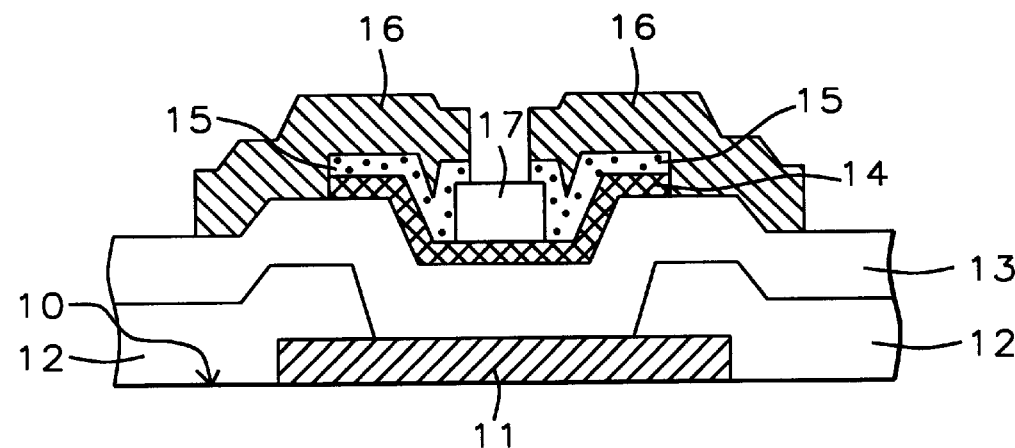

(j) As shown in FIG. 7G, form the source and the drain metal 16 of the TFT.

In the foregoing description, amorphous silicon is used as the active semiconductor material, and silicon nitride is used as the insulating layers. It should be understood that other semiconductor and other insulating material can also be used for the TFT structure, and are within the scope of this invention.

What is claimed is:

1. A method of manufacture of a thin film field effect transistor (TFT) device (FIGS. 7A–7G/8A–8H) on an insulating substrate, said device having an active region with a gate, a source region, a drain region and a channel, and a field region outside said active region, said method comprising:

forming a gate electrode (11) on said insulating substrate, said gate electrode (11) having exposed surfaces including electrode edges and a first top surface above said substrate, said first top surface having a central region inside the periphery of said gate electrode (11), forming a lower insulation structure (12 or 100/12) comprising at least one layer covering said exposed surfaces of said gate electrode (11), forming a first hollow in said lower insulation structure above said central region, said first hollow having a bottom above said gate electrode (11), said lower insulation structure covering at least said electrode edges with a greater thickness of said structure, whereby said lower insulation structure (12 or 100/12) has a greater thickness over said electrode edges than in said central region of said gate electrode (11), forming a blanket layer (13) comprising an insulation layer over said lower insulation structure (12 or 100/12) and said gate electrode (11), leaving a second hollow above said first hollow and above said central region, forming a blanket first semiconductor film (14) conformally covering said blanket layer (13) above said gate electrode (11), said first semiconductor film (14) extending down into said second hollow towards said channel window leaving a third hollow in said first semiconductor film (14) above said second hollow and above said central region, forming a heavily doped second semiconductor film (15) conformally covering at least a portion of said first semiconductor film (14) extending down into said third hollow leaving a fourth hollow in said second semiconductor film (15) above said third hollow and above said central region, patterning said first and said second semiconductor films (14/15) into a self-aligned island formed above said gate electrode (11), said island (14/15) being aligned with but shorter than said gate electrode (11), said first semiconductor film (14) serving as said channel of said TFT and said second semiconductor film (15) serving as said source region and said drain region of said TFT with a gap between said source region and said drain region, and forming a metal contact layer (16) above said second semiconductor film (15) and patterning said metal contact layer (16) to form metal contacts for said source and said drain (15) with said metal contacts (16) and with said second semiconductor film being self-aligned.

2. A method of manufacture of thin film field effect transistor (TFT) device (FIGS. 7A–7G) on an insulating substrate, said device having an active region with a gate, a source region, a drain region and a channel, and a field region outside said active region, said method comprising:

forming a gate electrode (11) on said insulating substrate, said gate electrode (11) having edges and having a top surface above said substrate, forming a first insulating layer (12) covering said substrate and said gate electrode (11), forming a channel window extending through said first insulating layer (12), inside the periphery of said gate electrode (11), down to said top surface of said gate electrode (11) leaving the periphery of said gate electrode (11) covered by said first insulating layer (12), leaving a first hollow formed by said channel window above said gate electrode (11), forming a second insulating layer (13) conformally covering said first insulating layer (12) and extending down into said channel window to cover said remainder of said top surface of said gate electrode leaving a second hollow above said channel window, forming a first semiconductor film (14) conformally covering said second insulating layer (13) above said gate electrode (11), said first semiconductor film (14) extending down into said second hollow towards said channel window leaving a third hollow above said channel window, forming a third insulating layer (17) covering said first semiconductor film (14) and leaving a fourth hollow above said channel window, patterning said third insulating layer (17) into an insulating block in said third hollow above said first semiconductor film (14) and said block being centered over said gate electrode (11) and said channel window, forming a heavily doped second semiconductor film (15) conformally covering opposing sidewalls of said insulating block (17) and over said first semiconductor film (14), said second semiconductor film (15) extending down into said third hollow above said channel window, patterning said first and second semiconductor films (14/15) into a self-aligned island formed above said gate electrode (11), said island being aligned with but shorter than said gate electrode (110) with said first semiconductor film (14) serving as said channel of said TFT, and said second semiconductor film (15) serving as said source region and said drain region of said TFT, forming a metal contact layer (16) above said second semiconductor film (15), and patterning said metal contact layer (16) to form metal contacts for said source and said drain (15) with said metal contacts (16) and said second semiconductor film (15) being aligned.

3. A method in accordance with claim 2, wherein said substrate comprises a transparent material.

4. A method in accordance with claim 2, wherein said third insulating layer (17) comprises SIN.

5. A method in accordance with claim 2, wherein said third insulating layer (17) is SiN and performing the step of densifying said SiN at a high temperature in excess of 250° C.

6. A method in accordance with claim 2, wherein said first semiconductor film (14) comprises amorphous silicon (a-Si).

7. A method in accordance with claim 2, wherein said second semiconductor film (15) comprises heavily doped amorphous silicon (a-Si).

8. A method in accordance with claim 2, wherein:
said substrate comprises a transparent material, said first semiconductor film (14) comprises amorphous silicon (a-Si), said second semiconductor film (15) comprises heavily doped amorphous silicon a-Si, said gate electrode (11) is composed of a material selected from the group consisting of Al, Cr, Ta and other refractory materials, and both said second insulating layer (13) and said third insulating layer (17) comprise silicon nitride (a-SiN).

9. A method of manufacturing of a thin film field effect transistor (TFT) device (FIGS. 7A–7G) on a transparent insulating substrate, said device having an active region with a gate, a source region, a drain region and a channel, comprising:

forming said transparent, insulating substrate, forming a gate electrode (11) on said transparent insulating substrate, said gate electrode (11) having edges and having a top surface above said substrate, said gate electrode (11) being longer than said active region, forming a first insulating layer (12) covering said substrate and said gate electrode (11), forming a channel window extending through said first insulating layer, inside the periphery of said gate electrode (11), down to said top surface of said gate electrode (11) leaving the periphery of said gate electrode (11) covered by said first insulating layer (12), forming a second insulating layer (13) both conformally covering said first insulating layer (12) and extending down into said channel window to cover said remainder of said top surface of said gate electrode (11) leaving a lower, first hollow above said window, forming a first semiconductor film (14) deposited on said second insulating layer (13), and patterned to a length aligned with but shorter than said gate electrode (11) and serving as said source, said drain and said channel for said TFT, said first semiconductor film (14) consisting of amorphous silicon, and said first semiconductor film (14) conformally covering said second insulating layer (13) extending down into said first hollow towards said channel window leaving an intermediate, second hollow above said first hollow, forming a heavily doped second semiconductor layer (15), which is heavily doped and patterned to form contacts for said source and said drain, said second semiconductor film (15) being composed of heavily doped amorphous silicon, and said heavily doped second semiconductor film conformally covering said first semiconductor film (14) extending down in said second hollow towards said channel window leaving an upper, third hollow above said second hollow, patterning said first and second semiconductor films (14/15) into a self-aligned island formed above said gate electrode (11), said island being aligned with but shorter than said gate electrode (11), said first semiconductor film (14) serving as said channel of said TFT and said second semiconductor film (15) serving as said source and said drain of said TFT, and forming a metal contact layer (16) above said second semiconductor film, and said metal contact layer (16) being patterned to form an interconnection to said source and said drain (15), and patterning said metal contact layer (16) to form metal contacts for said source and said drain (15), and with said metal contacts (16) and said second semiconductor film (15) being aligned.

10. A method as described in claim 9, wherein said gate electrode (11) is composed of a material selected from a refractory material and the group consisting of Al, Cr, and Ta metals.

11. A method as described in claim 9 wherein said first insulating layer (12) is composed of a material selected from the group consisting of $Al_2O_3$, $CrO_2$, and $TaO_x$.

12. A method as described in claim 9, wherein said second insulating layer (13) is composed of silicon nitride (a-SiN).

13. A method as described in claim 9, including the step of densifying said a-SiN is at a high temperature in excess of 250° C.

14. A method as described in claim 9, wherein said third insulating layer (17) is deposited over said channel region of said first semiconductor layer (14) in the active region before said second heavily doped semiconductor layer (15) is deposited and patterned.

15. A method as described in claim 14, wherein said third insulating layer (17) is SiN.

16. A method as described in claim 15 including the step of densifying said SiN is at a high temperature in excess of 250° C.

17. A method in accordance with claim 9, wherein said gate electrode (11) is composed of a metal selected from the group consisting of Al, Cr, Ta and other refractory metals.

18. A method in accordance with claim 9, wherein:

said gate electrode (11) is composed of a metal, said device includes a contact to said metal gate electrode (11) spaced away from said source region and said drain region with a first contact window through said first insulating layer (12) down to said gate electrode (11), said first contact window having sidewalls, said second insulating layer (13) covering both said first insulating layer (12) and extending down through said first contact window to cover the sidewalls of said first contact window and a portion of said gate electrode (11) adjacent to said window, with said second insulating layer (13) defining a second contact window, and contact metallization (16) reaching through said first and second contact windows to said top surface of said metal gate electrode (11).

19. A method in accordance with claim 9, wherein said first insulator (12) and said second insulator (13) are etched through for said metal to make contact with said metal gate electrode.

20. A method in accordance with claim 9, wherein:

said first semiconductor film (14) comprises amorphous silicon (a-Si), said second semiconductor film (15) comprises heavily doped a-Si, said gate electrode (11) is composed of a metal selected from the group consisting of Al, Cr, Ta and other refractory materials, said first insulating layer is composed of a material selected from the group consisting of $Al_2O_3$, $CrO_2$ and $TaO_x$, and said second insulating layer comprises silicon nitride (a-SiN).

21. A method of manufacture of thin film field effect transistor (TFT) device (FIGS. 7A–7G) on a substrate, said device having an active region with a gate, a source region, a drain region and a channel, said method comprising:

forming a gate electrode (11) on said substrate, said gate electrode having edges and having a top surface above said substrate, forming a first insulating layer (12) covering said substrate and said gate electrode (11), said first insulating layer (12) being composed of a material selected from the group consisting of $Al_2O_3$, $CrO_2$ and $TaO_x$, forming a channel window extending through said first insulating layer (12), inside the periphery of said gate electrode (11), down to said top surface of said gate electrode (11) leaving the periphery of said gate electrode (11) covered by said first insulating layer (12), leaving a first hollow in said window, forming a second insulating layer (13) conformally covering said first insulating layer (12) and extending down into said channel window to cover said remainder of said top surface of said gate electrode leaving a second hollow above said window, forming a first semiconductor film (14) conformally covering said second insulating layer (13) above said gate electrode (11), said first semiconductor film (14) extending down into said second hollow towards said channel window leaving a third hollow above said second hollow, said first semiconductor film (14) being composed of an amorphous semiconductor, forming a third insulating layer (17) conformally covering said first semiconductor film and extending down into said third hollow, patterning said third insulating layer into an insulating block (17) with sides and a top in said third hollow above said first semiconductor film (14) and said block (17) being centered over said gate electrode (11), forming a heavily doped second semiconductor film (15) conformally on said sides of said insulating block (17) and over said first semiconductor film (14), said second semiconductor film (14) extending down into said third hollow towards said channel window, patterning said first and second semiconductor films (14/15) into a self-aligned island formed above said gate electrode (11), said island being aligned with but shorter than said gate electrode (11), said first semiconductor film (14) serving as said channel of said TFT, and said second semiconductor film (15) serving as said source region and said drain region of said TFT, forming a metal contact layer (16) above said second semiconductor film, on the surface thereof, and patterning said metal contact layer (16) to form metal contacts (16) for said source and said drain with said metal contacts (16) and with said second semiconductor film (15) being self-aligned.

22. A method in accordance with claim 21, wherein said third insulating layer (17) is densified at a high temperature in excess of 250° C.

23. A method in accordance with claim 21, wherein said second semiconductor film (15) comprises heavily doped amorphous silicon (a-Si).

24. A method in accordance with claim 21, wherein said first semiconductor film (14) comprises amorphous silicon (a-Si).

25. A method in accordance with claim 21, wherein:
said first semiconductor film (14) comprises amorphous silicon (a-Si),
said second semiconductor film (15) comprises heavily doped amorphous silicon a-Si,
said gate electrode (11) is composed of a material selected from the group consisting of Al, Cr, Ta and other refractory materials, and
both said second insulating layer (13) and said third insulating layer (17) comprise silicon nitride (a-SiN).

26. A method of manufacture of thin film field effect transistor (TFT) device (FIGS. 8A–8H) on an insulating substrate, said device having an active region with a gate, a source region, a drain region and a channel, and a field region outside said active region, said method comprising:

forming a gate electrode (11) on said insulating substrate, said gate electrode (11) having exposed surfaces including first edges and a first top surface above said substrate, forming a first insulating layer (100) conformally covering said exposed surfaces of said gate electrode (11), said first insulating layer (100) having a second top surface and having second edges, forming a second insulating layer (12) conformally covering said substrate and said first insulating layer (100), forming a channel window extending through said second insulating layer (12), inside the periphery of said gate electrode (11), down to said top surface of said first insulating layer (100), leaving the periphery of said first insulating layer (100) covered by said second insulating layer (12) and forming a first hollow above said window, forming a third insulating layer (13) conformally covering both said second insulating layer (12) and extending down into said channel window to cover said remainder of said top surface of said first insulating layer (100) leaving a second hollow above said first hollow and above said window, forming a first semiconductor film (14) conformally covering said third insulating layer (13) above said gate electrode (11), said first semiconductor film (14) extending down into said second hollow towards said channel window leaving a third hollow above said second hollow and above said window, forming a heavily doped second semiconductor film (15) conformally covering said first semiconductor film (14) extending down into said third hollow towards said channel window above said third hollow and above said window centered above said gate electrode (11), leaving a fourth hollow above said third hollow and above said window, patterning said first and second semiconductor films (14/15) into a self-aligned island formed above said gate electrode (11), said island (14/15) being aligned with but shorter than said gate electrode (11), said first semiconductor film (14) serving as said channel of said TFT and said second semiconductor film (15) serving as said source region and said drain region of said TFT, and forming a metal contact layer (16) above said second semiconductor film (15) and patterning said metal contact layer (16) and said second semiconductor film (15) to form metal contacts for said source and said drain with said metal contacts (16) and with said second semiconductor film being self-aligned.

27. A method in accordance with claim 26, wherein said first insulating layer (100) is composed of a material selected from the group consisting of $Al_2O_3$, $CrO_2$ or $TaO_x$.

28. A method in accordance with claim 26, wherein:
said gate electrode (11) is composed of a material selected from the group consisting of tantalum and aluminum,
said device including a contact to said gate electrode (11) spaced away from said source region and said drain region with a first contact window through said first insulating layer (100) down to said top surface of said gate electrode, said second insulating layer (13) covering both said first insulating layer (100) with a second contact window aligned with said first contact window, and contact metallization (16) reaching through said first and second contact windows to said top surface of said gate electrode (11).

29. A method of manufacture of thin film field effect transistor (TFT) device on an insulating substrate, (FIGS. 8A–8H) said device having an active region with a gate, a source region, a drain region and a channel, said method comprising:

forming a gate electrode (11) on said insulating substrate, said gate electrode having exposed surfaces including first edges and a first top surface above said substrate, forming a planar first insulating layer (100) conformally covering said exposed surfaces of said gate electrode, said first insulating layer having a second top surface and having second edges, said first insulating layer being composed of a material selected from the group consisting of $Ta_2O_5$, and $Al_2O_3$, forming a second insulating layer (12) conformally covering said substrate and said first insulating layer, said second insulating layer material selected from the group consisting of $Al_2O_3$, $CrO_2$ and $TaO_x$, forming a channel window extending through said second insulating layer, inside the periphery of said gate electrode (11), down to said top surface of said first insulating layer, leaving the periphery of said first insulating layer covered by said second insulating layer and forming a first hollow above said gate electrode (11), forming a third insulating layer (13) composed of a-SiN conformally covering both said second insulating layer and extending down into said first hollow in said channel window to cover said remainder of said top surface of said first insulating layer (100) leaving a second hollow above said first hollow and said channel window, forming a first semiconductor film (14) consisting of an amorphous film, said first semiconductor film conformally covering said third insulating layer above said gate electrode said first semiconductor film, said first semiconductor film extending down into said second hollow towards said channel window leaving a third hollow above said second hollow, forming a heavily doped second semiconductor film (15), said heavily doped second semiconductor film conformally covering said first semiconductor film extending down into said third hollow towards said channel window leaving a fourth hollow above said third hollow, patterning said first and second semiconductor films (14/15) into a self-aligned island formed above said gate electrode, said island being aligned with but shorter than said gate electrode, said first semiconductor film serving as said channel of said TFT and said second semiconductor film serving as said source region and said drain region of said TFT, and forming a metal contact layer (16) above said second semiconductor film on the surface thereof and patterning said metal contact layer to form metal contacts for said source and said drain with said metal contacts and with said second semiconductor film being self-aligned.

30. A method in accordance with claim 29, wherein:

said gate electrode (11) is composed of a metal selected from the group consisting of tantalum and aluminum, said device including a contact to said gate electrode (11) spaced away from said source region and said drain region with a first contact window through said first insulating layer (12) reaches down to said top surface of said gate electrode (11), said second insulating layer (13) covering said first layer (12) with a second contact window aligned with said first contact window, and contact metallization reaching through said first and second contact windows to said top surface of said gate electrode (11).

* * * * *